United States Patent
Abere et al.

(10) Patent No.: US 10,431,455 B2
(45) Date of Patent: Oct. 1, 2019

(54) FEMTOSECOND LASER-INDUCED FORMATION OF SINGLE CRYSTAL PATTERNED SEMICONDUCTOR SURFACE

(71) Applicant: THE REGENTS OF THE UNIVERSITY OF MICHIGAN, Ann Arbor, MI (US)

(72) Inventors: Michael J. Abere, Albuquerque, NM (US); Steven Yalisove, Ann Arbor, MI (US); Ben Torralva, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 0 days.

(21) Appl. No.: 15/760,549

(22) PCT Filed: Sep. 16, 2016

(86) PCT No.: PCT/US2016/052212
§ 371 (c)(1),
(2) Date: Mar. 15, 2018

(87) PCT Pub. No.: WO2017/053198
PCT Pub. Date: Mar. 30, 2017

(65) Prior Publication Data
US 2018/0277366 A1  Sep. 27, 2018

Related U.S. Application Data

(60) Provisional application No. 62/219,805, filed on Sep. 17, 2015.

(51) Int. Cl.
*B23K 26/53* (2014.01)
*H01L 21/02* (2006.01)
(Continued)

(52) U.S. Cl.
CPC .... *H01L 21/02686* (2013.01); *B23K 26/0624* (2015.10); *B23K 26/53* (2015.10);
(Continued)

(58) Field of Classification Search
CPC ......... H01L 21/02686; H01L 21/02521; H01L 21/02587; H01L 21/02549;
(Continued)

(56) References Cited

U.S. PATENT DOCUMENTS 7,884,446 B2  2/2011  Mazur et al.
8,143,686 B2  3/2012  Mazur et al.
(Continued)

FOREIGN PATENT DOCUMENTS

KR  10-2012-0107349 A  10/2012

OTHER PUBLICATIONS

International Search Report and Written Opinion issued in PCT/US2016/052212, dated Mar. 20, 2017; ISA.KR.

*Primary Examiner* — Kyoung Lee
(74) *Attorney, Agent, or Firm* — Harness, Dickey & Pierce, P.L.C.

(57) ABSTRACT

The interaction between multiple intense ultrashort laser pulses and solids typically produces a regular nanoscale surface corrugation. A coupled mechanism has been identified that operates in a specific range of fluences in GaAs that exhibits transient loss of the imaginary part of the dielectric function and X2, which produces a unique corrugation known as high spatial frequency laser induced periodic surface structures (HSFL). This mechanism is unique in that the corrugation does not involve melting or ablation.

11 Claims, 10 Drawing Sheets

Figure 1:
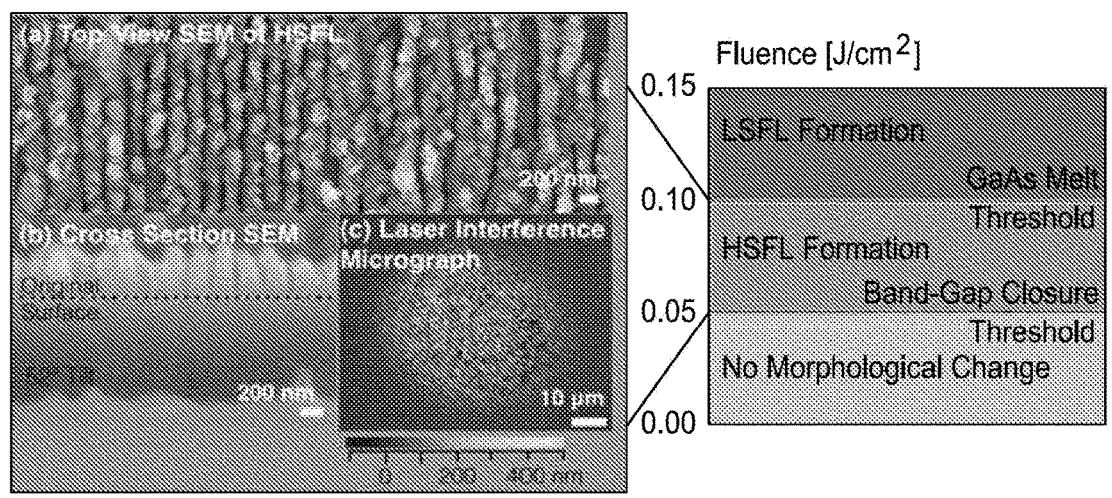

(51) Int. Cl.
*B23K 26/0622* (2014.01)
*B23K 103/00* (2006.01)

(52) U.S. Cl.
CPC .. *H01L 21/02521* (2013.01); *H01L 21/02546* (2013.01); *H01L 21/02549* (2013.01); *H01L 21/02587* (2013.01); *B23K 2103/56* (2018.08)

(58) Field of Classification Search
CPC .............. H01L 21/02546; B23K 26/53; B23K 26/0624; B23K 2103/56
See application file for complete search history.

(56) References Cited

U.S. PATENT DOCUMENTS

| | | |
|---|---|---|
| 8,802,549 B2 | 8/2014 | Sickler et al. |
| 8,860,034 B2 | 10/2014 | Prushinskiy et al. |
| 2006/0079062 A1 | 4/2006 | Mazur et al. |
| 2007/0263974 A1* | 11/2007 | Khrushchev ............ C30B 29/20 385/141 |
| 2008/0032237 A1 | 2/2008 | Wong et al. |
| 2010/0219506 A1 | 9/2010 | Gupta et al. |
| 2011/0121206 A1 | 5/2011 | Mazur et al. |

\* cited by examiner

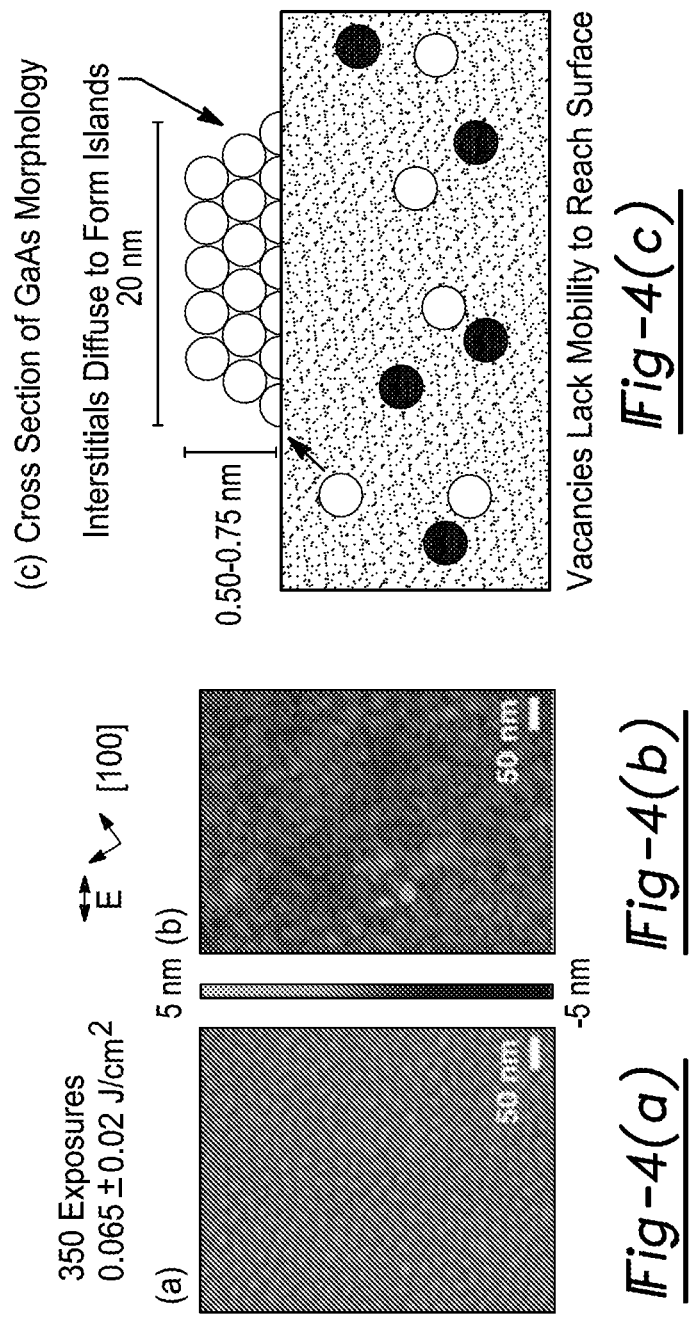

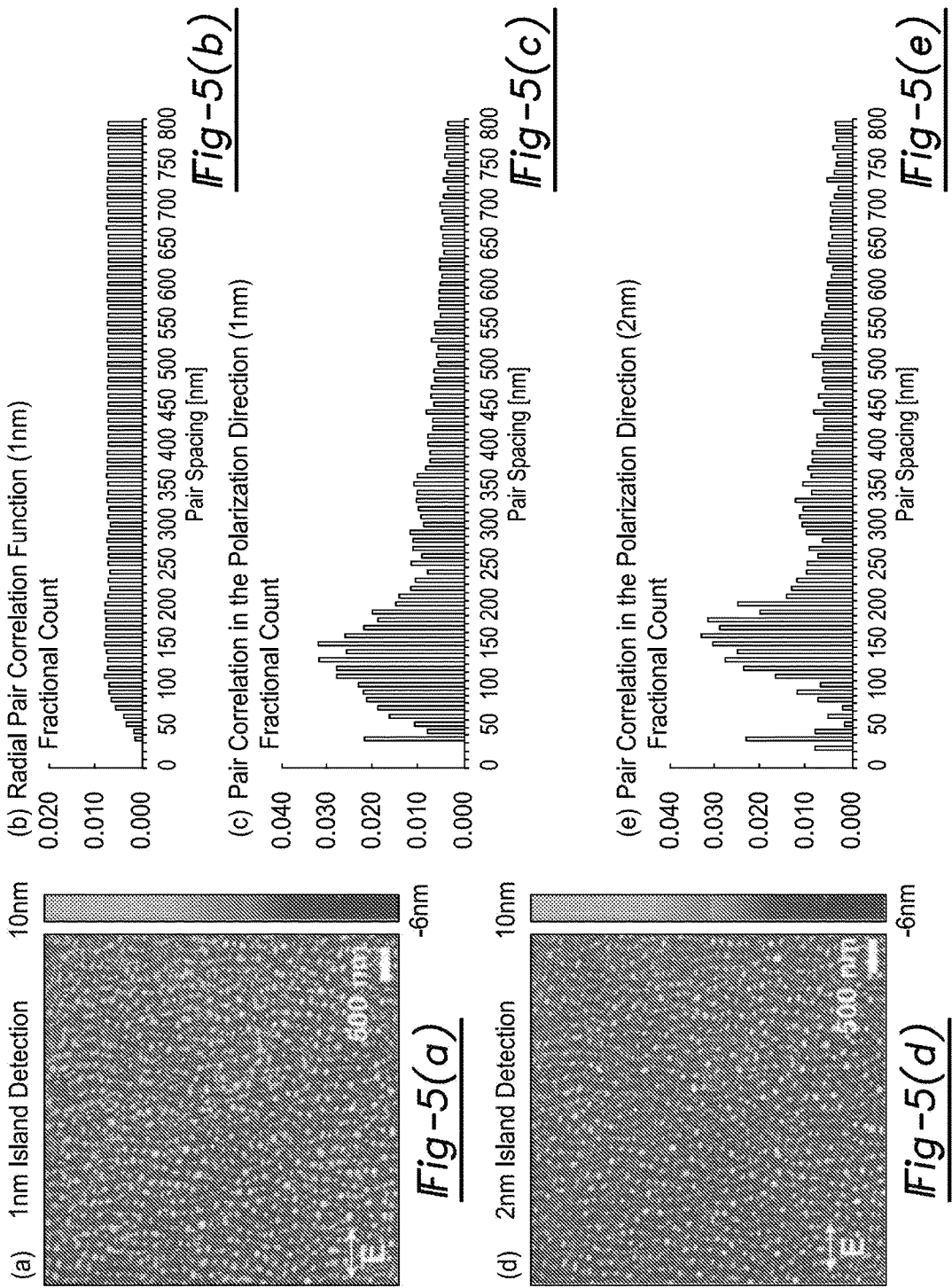

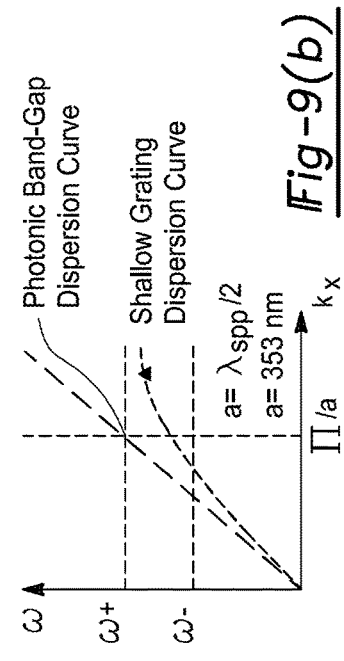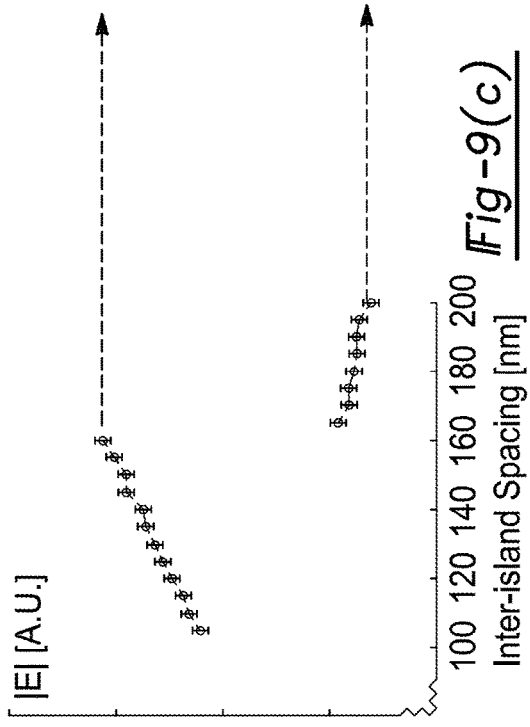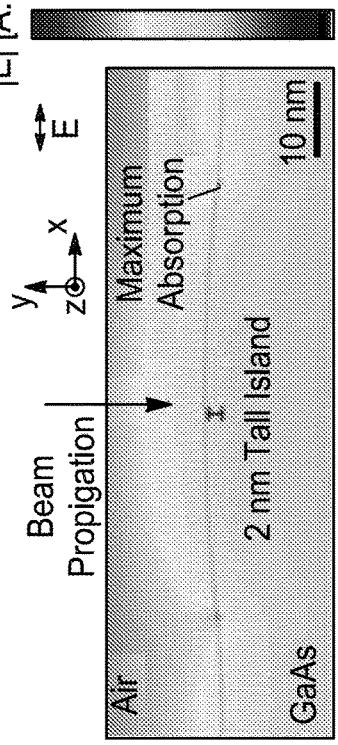

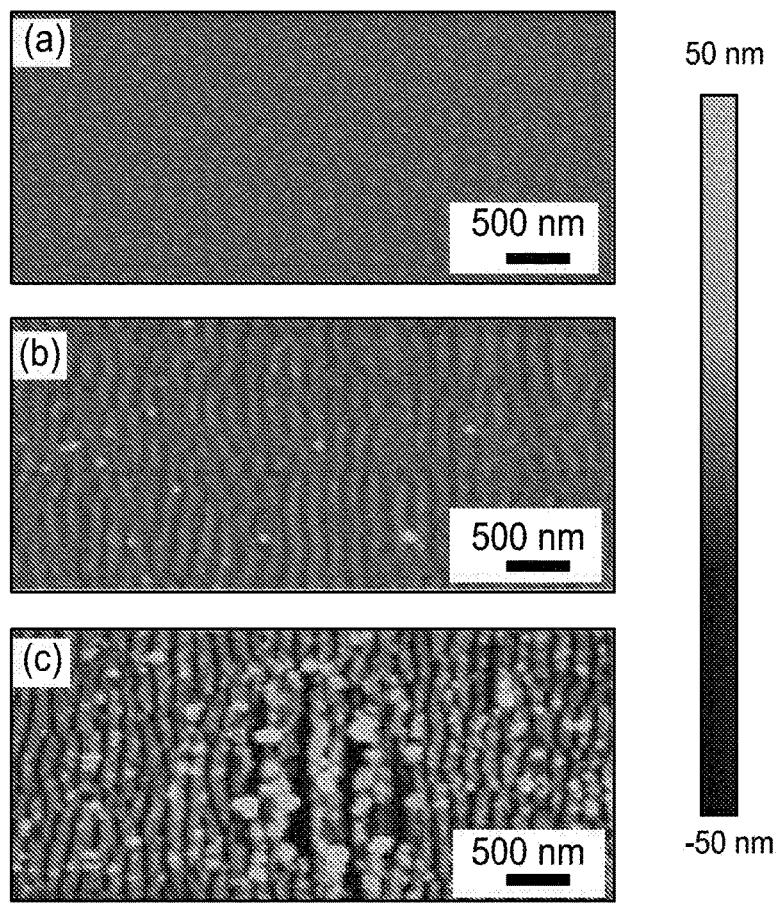
Fig-10(a)
Fig-10(b)
Fig-10(c)
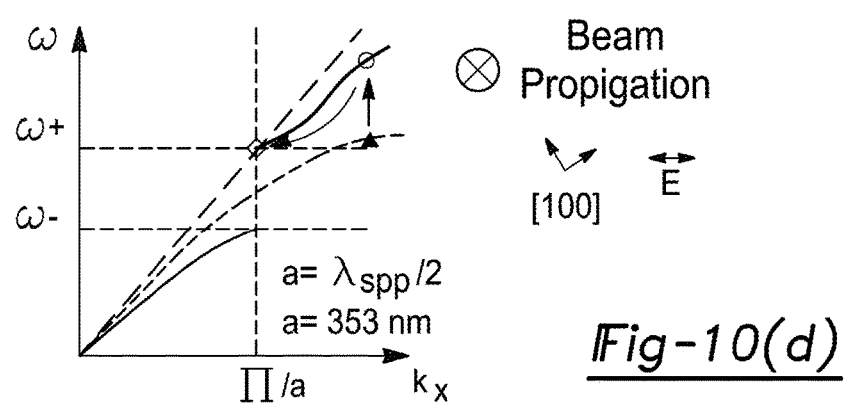
Fig-10(d)

(e) Simulation of SPP Charge Distribution vs 30 nm Grating (f) Simulation of SPP Charge Distribution vs 52 nm Grating $|E|$ [A.U.]

FEMTOSECOND LASER-INDUCED FORMATION OF SINGLE CRYSTAL PATTERNED SEMICONDUCTOR SURFACE

CROSS REFERENCE TO RELATED APPLICATIONS

This application is a U.S. National Phase Application under 35 U.S.C. 371 of International Application No. PCT/US2016/052212 filed on Sep. 16, 2016 and published in English as WO 2017/053198 A2 on Mar. 30, 2017. This application claims the benefit of U.S. Provisional Application No. 62/219,805, filed on Sep. 17, 2015. The entire disclosures of the above applications are incorporated herein by reference.

GOVERNMENT INTEREST

This invention was made with government support under FA9550-12-1-0465 awarded by the Air Force Office of Scientific Research. The Government has certain rights in the invention.

FIELD

The present disclosure generally relates to methods of processing semiconductor surfaces by modifying the surface topography and, more particularly, relates to femtosecond laser-induced formation of a single crystal patterned semiconductor surface without melting or ablation.

BACKGROUND AND SUMMARY

This section provides background information related to the present disclosure which is not necessarily prior art. This section also provides a general summary of the disclosure, and is not a comprehensive disclosure of its full scope or all of its features.

Modifying semiconductor surface topography is a common method for enhancing light absorption within various optoelectronic applications. Many surface patterning techniques do not retain the semiconductor's original crystal structure, which leads to efficiency losses within devices. The reason for this is that either ablation or at least melting occurs in all of these techniques, which leads to significant disruption of the lattice. Hence, there is need for surface processing methods that can largely retain a single crystal structure within the patterned region.

The interaction between multiple intense ultrashort laser pulses and solids universally produces a regular surface corrugation. We have identified a coupled mechanism that operates in a specific range of fluences in semiconductors between the band-gap collapse and ultrafast-melt thresholds that produce a unique corrugation known as high spatial frequency laser induced periodic surface structures (HSFL). The structures have period <0.3 times the laser wavelength and are predominately epitaxial single crystal. What makes this process unique is that the corrugation is produced without any melting or ablation. HSFL formation is initiated when the intense laser field softens the interatomic binding potential, which leads to an ultrafast generation of point defects. The interplay between surface plasmon polaritons that localize defect generation and transient surface morphologies driven by strain relaxation, via diffusing defects, results in the evolution and eventual completion of HSFL formation. This process can occur in ambient condition (in air) without the need for a high vacuum system. This is a remarkable finding in itself because it has been commonly believed that epitaxial redistribution near a surface requires a vacuum.

Accordingly, the teachings of the present invention are applicable to a wide range of devices including but not limited to solar cells, batteries, chemical, biological, light sensors, and the like. The ability to process in air makes this novel approach even more attractive for producing a product. Furthermore, this process is easily combined with traditional manufacturing methods for these kinds of devices such as, but not limited to, molecular beam expitaxy, chemical beam expitaxy, gas entrainment deposition, atomic layer deposition, and sputter deposition. Such combinations, along with thermal annealing techniques, greatly enhance our claims as we can produce pn junctions, Schottky or Ohmic contacts, modulation doped layers, etc. to create novel devices.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 1. HSFL formation from mass redistribution below melt threshold. (a) HSFL formation in GaAs after 1,500 exposures at $0.065\pm0.005$ J/cm$^2$ (b) Cross-section SEM and (c) laser interference micrograph showing that HSFL arise from mass redistribution after 1,500 exposures to a height of $190\pm20$ nm. HSFL formation is observed between two sharp thresholds in fluence that correspond to a range between ultrafast melt and band-gap closure.

FIG. 2. Crystalline structure of HSFL. (a) Bright Field STEM image of HSFL along the [110] zone axis. Structures were covered in Au and Pt during TEM sample preparation. Diffraction contrast within the HSFL corresponds to misoriented grains. GaAs remains epitaxial (b) 80 nm above and (c) below the initial surface. (d) Typical cross-section STEM EDS spectrum showing that HSFL are composed of stoichiometric GaAs. An FEFD simulation in (e) shows that the structures become nanocrystalline where the local absorbed intensity is the highest. (f) Schematic of HSFL bifurcation.

FIG. 3. HSFL evolution vs number of laser exposures. HSFL formation after irradiation at a fluence of $0.065\pm0.005$ J/cm$^2$ after (a) 250 (b) 400, (c) 500, (d) 600, (e) 700, and (f) 1,000 exposures. Morphologies are characteristic of laser damage spots with a variance of $\pm50$ exposures between experiments. Islands and pits in (b) self-organize into the $165\pm60$ nm population in (c). The LIPSS period first increases to $355\pm60$ nm in (d) and (e) before going through a bifurcation to $180\pm50$ nm in (f).

FIG. 4. Random island precursors to HSFL. (a) SEM of islands with $\approx20$ nm diameter and (b) AFM showing height <1 nm formed after 350 exposures at 0.065 J/cm2. (c) Schematic of island formation after ultrafast laser generated vacancy/interstitial pairs dissociate with higher mobility interstitials diffusing to the free surface.

FIG. 5. Pair correlation function of island spacings. Island detection of an AFM image with a threshold height after irradiation with 400 exposures at 0.065 J/cm$^2$ of (a) 1 nm, the (b) corresponding radial pair correlation function, and (c) the corresponding pair correlation function in the direction of the laser polarization. The peak is centered at 150 nm with a full width half max of 190 nm. Island detection of an AFM image with a threshold height of (d) 2 nm and the (e) corresponding pair correlation function in the polarization direction. The peak is centered at 165 nm with a full width half max of 100 nm.

Figure 6A:
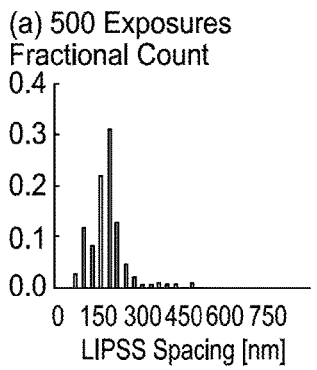
Figure 6B:
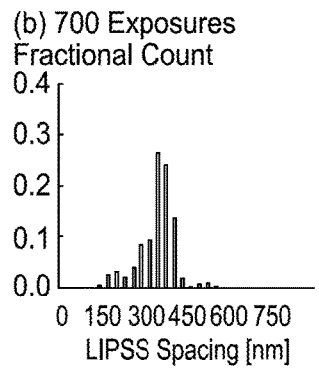
Figure 6C:
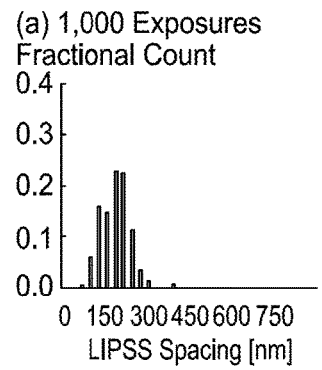

FIG. 6. Histograms of the structure spacing in the direction of the laser polarization. LIPSS spacing after (a) 500, (b) 700, and (c) 1,000 exposures at 0.065±0.005 J/cm². The distribution of periods for each histogram is directly measured from the structure spacings for the aligned features in the SEM images in FIG. 2.

FIG. 7. Quantum molecular dynamics simulations of ion displacements. (a) Average displacement of Ga (green), As (blue), and one particular As anion (red). The laser fluence was 0.199 J/cm², 18.4% below the band-gap closure threshold. The laser pulse starts at 200 fs, and the total pulse duration is 150 fs. (b) Average displacement of Ga (green) and As (blue). The laser fluence was 0.244 J/cm², the band-gap closure threshold. The laser pulse starts at 200 fs, and the total pulse duration is 150 fs. Notice the gradual rise of the average displacement that begins at ≈800 fs that indicates the onset of diffusive behavior.

Figure 8:
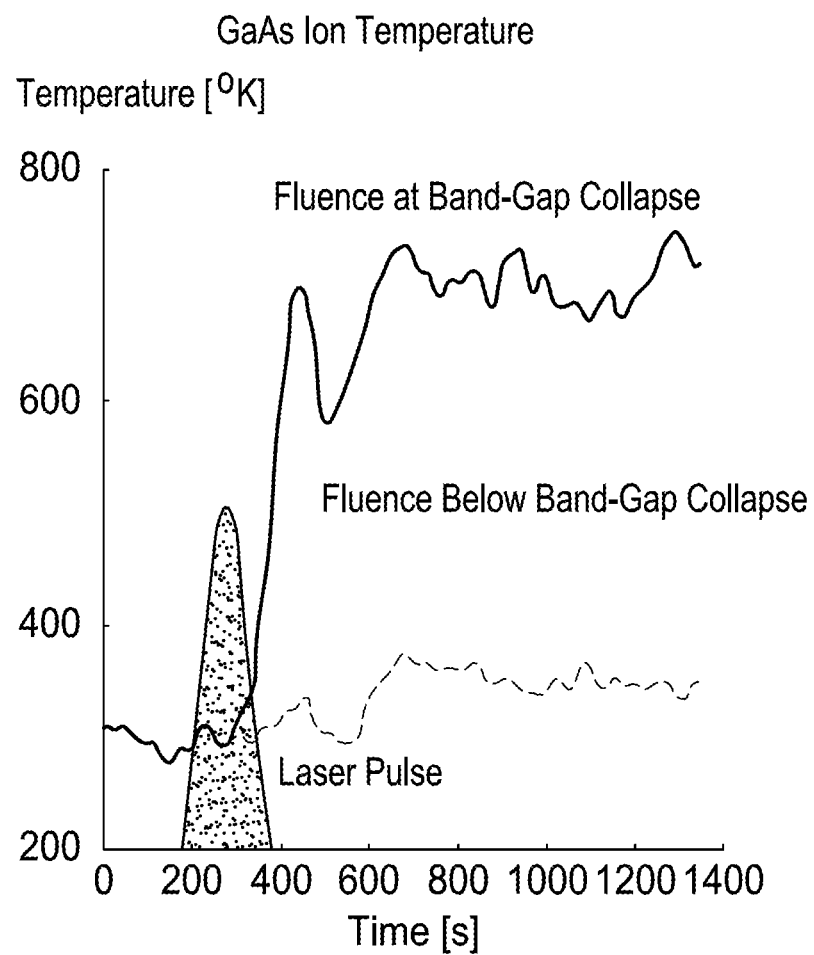

FIG. 8. Quantum molecular dynamics simulations of ion temperatures. The GaAs ion temperature for laser pulses with total duration 150 fs starting at 200 fs and fluence 0.199 J/cm² (red) and 0.244 J/cm² (blue).

FIG. 9. Finite element frequency domain simulations of SPP coupling during island alignment. (a) Simulation of locally absorbed laser field from a 2 nm tall island. Absorption is most strongly enhanced in the grating sidewalls. (b) Schematic of grating coupled SP-photonic band-gap dispersion curve. The grating formed by the aligned islands and pits couples to the shallow grating dispersion curve signified by the purple triangle (c) Relative intensity in the grating sidewall vs inter-island spacing for islands with height and diameter scaled to experimental values. The nucleation of pits causes the local intensity to sharply drop and pins the inter-island spacing. (d) Schematic of island only and (e) island/pit gratings FIG. 10. SPP coupling of self-assembled surface morphological structures. AFM image of coarsened islands after (a) 400 exposures, 165 nm grating after (b) 500 exposures, and locally nucleating 355 nm LIPSS after (c) 600 exposures. Fluence in all images is 0.065±0.005 J/cm². (d) Schematic representation of the SPP dispersion behavior that leads to the nucleation of the 355 nm LIPSS. When the 165 nm LIPSS are less than 50 nm tall, SPPs couple along the shallow grating dispersion curve, shown by the purple triangle. This behavior is modeled in (e). Increasing height over 50 nm allows coupling along the upper branch of the dispersion curve at the green circle. This behavior is modeled in (f). The 355 nm LIPSS form when the SPP couples to the band-edge at the red diamond.

Corresponding reference numerals indicate corresponding parts throughout the several views of the drawings.

DETAILED DESCRIPTION

Example embodiments will now be described more fully with reference to the accompanying drawings. Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Morphological evolution is fundamental to materials science. There are many driving forces for evolution, which include evaporation condensation, thermal diffusion, wetting/dewetting, stress/curvature relaxation, and interactions with coherent fields. Laser irradiation allows for the formation of surface morphological structures that can be controlled with nanoscale precision. Laser induced periodic surface structures (LIPSS) are a long studied morphology formed after the irradiation of solids with coherent light. The LIPSS orient with their long axis either parallel or perpendicular to the laser polarization and appear in metals, semiconductors, and insulators after irradiation with both continuous wave and pulsed lasers. By compressing light pulses down to the femtosecond timescale, solids can routinely be irradiated at intensities on the order of 1011-1013 W/cm2 while only depositing microjoules of energy into the material. These ultrashort pulsed lasers excite solids into an unusual non-equilibrium state where the electrons have temperatures exceeding 10,000° K while the lattice remains at room temperature. Moreover, the excited non-equilibrium carrier density can be large enough to substantially change a semiconductor's interatomic binding potential. When semiconductors are irradiated with ultrashort pulsed lasers, two distinct sub-wavelength LIPSS populations form that are commonly differentiated based on their period as being either low spatial frequency LIPSS (LSFL) or high spatial frequency high spatial frequency LIPSS (HSFL).

LSFL can form on a smooth surface with as few as two exposures. The first exposure ablates material creating features, such as crater edges, on the surface. On the second exposure, LSFL form when ultrashort laser pulses interact with a roughened semiconductor surface. Excitation generates a dense electron-hole plasma driving the real part of the semiconductor's dielectric function negative, which allows light to couple to plasmons to form surface plasmon polaritons (SPPs). The surface features formed on the first laser exposure allow the light to interact with parts of the surface at a nonzero angle, which provides the necessary component of momentum in the surface direction, perpendicular to the laser polarization, for the photons to excite SPPs. The LSFL form with their long axis perpendicular to the laser polarization via selective ablation where the SPP is locally most intense. The LSFL initially form at ASPP, which varies depending on the plasma density. On subsequent laser exposures, the SPPs can couple to the pre-existing LSFL at a grating coupled wavelength shorter than ASPP. When SPPs interact with a pre-existing grating, they Bragg scatter, which leads to a decrease in the grating coupled wavelength as more material is removed after each pulse until it reaches a minimum at λSPP/2.

On the other hand, semiconductor HSFL have periods substantially less than λSPP/2, and this work will show that in GaAs they evolve through multiple periods en route to a spacing of λSPP/4. HSFL form after hundreds to thousands of exposures at fluences below the threshold for the material ablation. Existing models suggest that the HSFL period may be due to second-harmonic generation during the laser-material interaction or strong coupling to a high frequency SPP mode. A third model relates HSFL formation to the selective sputtering that induces ripples after ion beam irradiation. A complete model for HSFL formation, however, requires a fundamental understanding of the dynamical pathway the semiconductor takes back to equilibrium, from the laser excited state, that ties a repeated electronic excitation to a multi-step morphological evolution. This work provides the theoretical backing to a coupled defect diffusion and SPP based model for HSFL formation in GaAs through quantum molecular dynamics (QMD) and near-field electromagnetic finite element frequency domain (FEFD) calculations. The combined experimental and modeled results show that semiconductor HSFL formation originates from an ultrafast generation of interstitial/vacancy pairs. The ensuing morphological evolution arises from the interplay between defect diffusion, driven through stress relaxation, and the localization of defect generation, via SPP coupling, to a cascade of transient surface morphologies. Control over such a mechanism and each of the intermediate morphologies formed during evolution opens the potential for ultrafast laser driven self-assembly of epitaxial surface morphological nanostructures.

II. Experimental

Femtosecond laser irradiation was performed on (100) AXT epi-ready semi-insulating undated GaAs wafers. Wafers had a native oxide of ≈10 Å Ga2O3. Samples were cleaned with trichloroethylene, acetone, and methanol to remove any organics from the surface both before and after irradiation. A control experiment using a 500 nm GaAs buffer layer grown in molecular beam epitaxy was also performed to ensure that the observed HSFL evolution did not depend on any effects from wafer polishing or carbon impurities in the as received wafers.

The laser used in these experiments was a Clark MXR Ti:sapphire pulsed at 150 fs with a repetition rate of 1 kHz, linearly polarized with a central wavelength of 780 nm, and maximum pulse energy of 800 μJ. Experiments were conducted in air at normal incidence. Single exposure experiments were conducted by translating the sample such that individual exposures were separated by at least four times the beam's 1/e2 focused radius as measured with a WinCam D beam profiler. For multiple exposure experiments, the sample remained stationary and a Stanford DG535 timing box connected to a Uniblitz Model 301B shutter controlled the number of shots. Experiments were performed with both a ≈40 μm beam and a ≈200 μm spot focused using f=20 cm and f=100 cm plano-convex lenses, respectively. Damage morphology was investigated with respect to fluence. The peak fluence from a Gaussian beam is 2·Etotal divided by the spot size at the 1/e2 radius. Etotal is calculated by measuring the average laser power with a Ophir Optics, LLC thermal power sensor and dividing by the repetition rate. Local fluence away from the spot center was calculated using a Gaussian fit to the imaged beam profile. Reported error in fluence represents the day to day repeatability for forming each morphology.

The reported laser damage thresholds were experimentally determined by plotting the relationship between optical contrast and fluence. Amorphous GaAs melted by the laser is detectable with differential interference contrast in an optical microscope. The damage threshold is defined as the fluence at which the area of the optical contrast from the re-solidified material approaches zero. For statistical purposes, nine damage spots were measured for each fluence. From each area, an effective radius is calculated by taking the square root of the area over π. The relationship between fluence and effective radius is calculated using the equation below:

$$r_a = (r_f/2^{1/2}) \cdot \ln(F/F_{Th})^{1/2} \tag{1}$$

where $r_a$ is the effective damage spot radius, $r_f$ is the 1/e2 beam waist, F is the peak fluence, and $F_{Th}$ is the threshold fluence. The effective radius for a given peak fluence at which the local fluence is equal to the threshold fluence occurs at the edge of the crater. The threshold fluence is calculated using a two-parameter fit to Equation 1.

The HSFL height above the initial surface was determined using two corroborating techniques. Cross-sectional scanning electron microscopy (SEM) was performed by cutting a trench with a focused ion beam from outside the spot to the spot center. The original surface was marked and the beam was translated to the LIPSS region. The second technique used was laser interference microscopy. Although the lateral resolution of an optical technique is insufficient to see individual structures, the 20 nm height resolution is sufficient for characterizing the top of structures an order of magnitude taller.

Scanning transmission electron microscopy (STEM) samples were made using focused ion beam lift-out on an FEI NOVA SEM. Samples were prepared by first sputter depositing 50 nm of Au to protect the surface during lift-out to ensure that the Pt deposition was not eroding the surface. Additionally, 2 μm of Pt were deposited as additional protection from ion beam milling using the electron beam. STEM was performed on an aberration corrected JEOL 2100 microscope.

III. Evolution of Self-Assembled Surface Structures

A. Overview of Transient Surface Morphologies During HSFL Formation

Figure 2A:
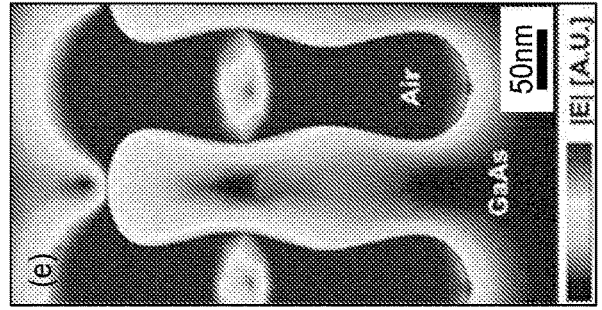
Figure 2B:
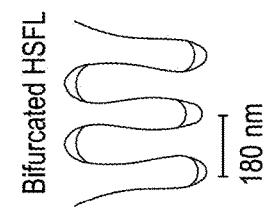
Figure 2C:
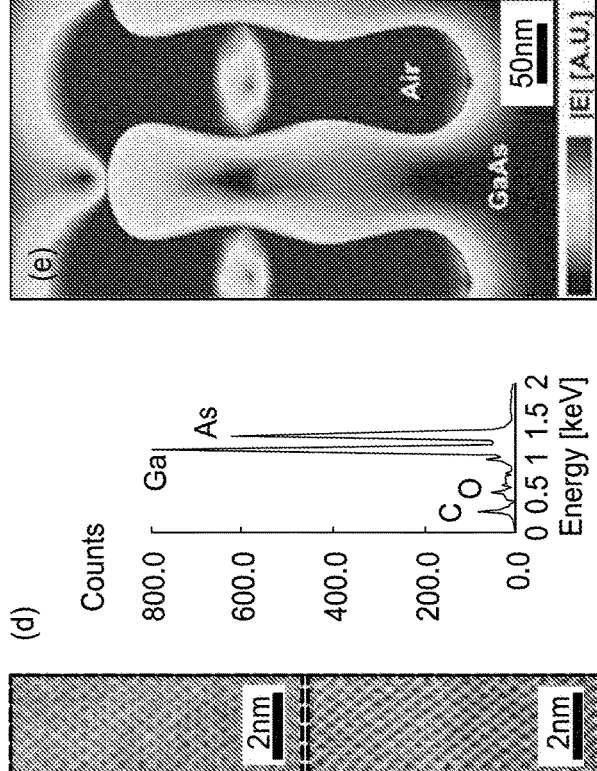
Figure 2D:
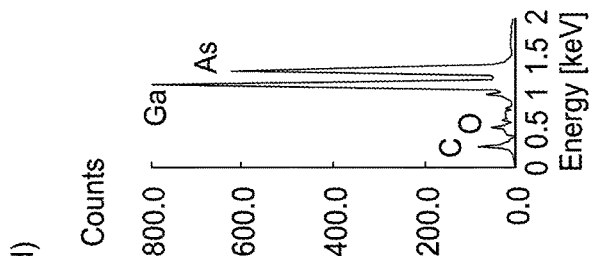
Figure 2E:
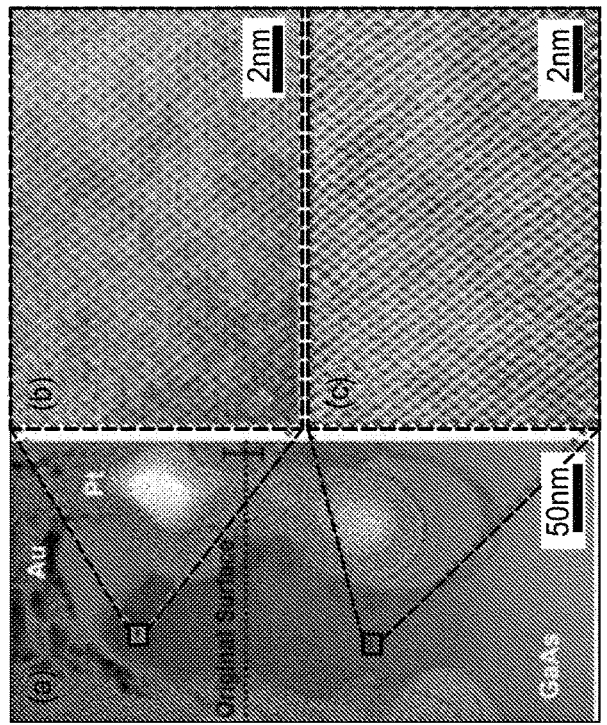
Figure 2F:
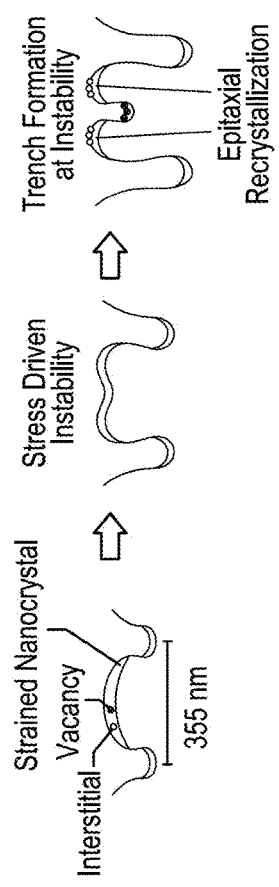

Experiments were conducted on single crystal GaAs due to its thoroughly characterized laser-material interaction thresholds for material removal, ultrafast melt, and band-gap closure. Irradiation at normal incidence in air at a 1 kHz repetition rate produced HSFL perpendicular to the laser's linear polarization at fluences between 0.1±0.01 J/cm2 and 0.050±0.005 J/cm2 as shown in FIG. 1(a). Both of these threshold fluences are sharp with no HSFL formation above or below the aforementioned range regardless of laser spot size or the number of exposures. Physically, this range corresponds to fluences that initiate transient loss of the imaginary part of the dielectric function and $X_2$ that fully recover the optical properties without melting the semiconductor, which will be referred to as band-gap closure. Since semiconductors universally exhibit this fluence regime and HSFL formation exclusively below the melt threshold, GaAs is considered here as a model material for HSFL formation in semiconductors. Rotating the crystal did not change the HSFL orientation with respect to the laser polarization for irradiation of the (100) surface. The SEM images shown throughout this work were taken at the center of the 200 μm beam such that local fluence including beam pointing stability between exposures varies by <0.01 J/cm2 across an image. The HSFL form via a mass redistribution process and not material ablation. FIGS. 1(b) and 1(c) show in cross-section SEM and laser interference microscopy, respectively, that HSFL rise 190±20 nm above the original surface after 1,500 exposures at 0.065 J/cm2 and have a peak-to-valley amplitude, as shown below in the cross-section STEM image in FIG. 2(a), of 350-400 nm. The mass redistributed above the original surface remains epitaxial to the underlying semiconductor for at least 80 nm as shown in FIG. 2(b) and is characterized in cross-sectional STEM energy dispersive X-ray spectrometry to be stoichiometric GaAs as shown in FIG. 2(d). The light STEM contrast in FIG. 2(a) at the structure crests and troughs corresponds to nanocrystalline regions within the HSFL.

An overview of the evolution of this mass redistribution is shown in the SEM images in FIG. 3. The number of exposures to a specific morphology varied by ±50 exposures due to a combination of day-to-day variation in laser performance and the random nature of structure nucleation and growth. Images of the evolution of the HSFL formation in GaAs are shown at a consistent peak fluence of 0.065±0.005 J/cm2. The first observable morphology during HSFL evolution forms after 350 exposures at and appears as surface roughness in the SEM image in FIG. 3(a). Further characterization in high resolution SEM and atomic force microscopy (AFM) of this roughness shows in FIGS. 4(a) and (b) respectively that it is comprised of a random distribution of islands, 20 nm in diameter and ≈1 nm tall. These islands grow to an average diameter of 60 nm with a height of ≈2 nm as shown in FIGS. 3(b) and 5(a) after 400 exposures and begin to align into LIPSS perpendicular to the laser polarization. Accompanied by the alignment, the first appearance of small pits are observed.

Characterization in AFM of the islands and pits formed after 400 exposures is shown in FIG. 5. The average island spacing was determined by calculating a pair-correlation function from AFM images. FIGS. 5(a) and (d) show particle detection of AFM images and corresponding pair correlation functions for islands formed after 400 exposures. Correlation functions were calculated assuming periodic boundary conditions on the image. The correlation function from a 1 nm island detection threshold is shown in FIG. 5(b). While FIG. 5(b) shows that the AFM image is uncorrelated radially, there are preferential spacings in the direction of the laser polarization in FIG. 5(c). The broad peak is centered at 150 nm with a FWHM of 190 nm. Increasing the particle detection threshold to 2 nm in FIGS. 3d and 3e raises the average correlation distance to 165 nm in the direction of the laser polarization and reduces the FWHM to 100 nm. The taller islands are spaced further apart, which is consistent with islands growing to larger spacings as the surface evolves. Alignment of the islands into rows perpendicular to the laser polarization with this 165 nm spacing is only observed in the presence of both islands and pits, which appear as dark contrast in the AFM images in FIG. 5(d). It should also be noted that since the 2 nm islands have an average diameter of ≈60 nm, the peak at 40 nm spacing in FIG. 3e is an artifact of the calculation due to island agglomeration, which occurs because a single surface structure formed by two agglomerated islands can have a height profile that dips below the 2 nm threshold in the center and is counted as two particles in the pair correlation function. The coupled mechanisms responsible for these phenomena with further irradiation are detailed in the section on morphological evolution below.

Figure 3A:
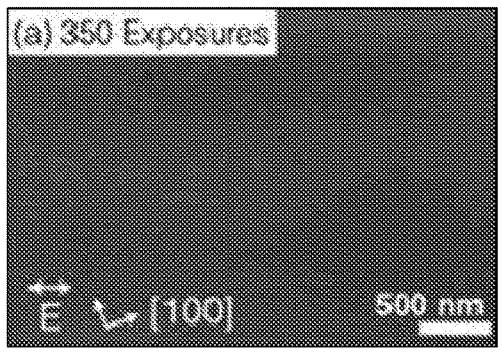
Figure 3B:
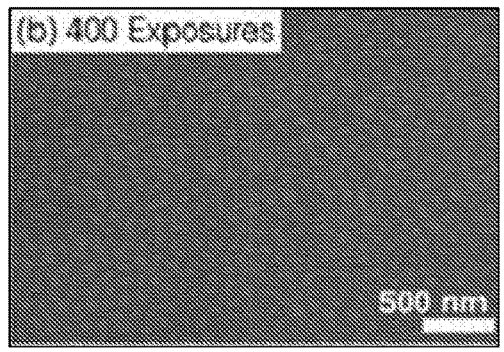
Figure 3C:
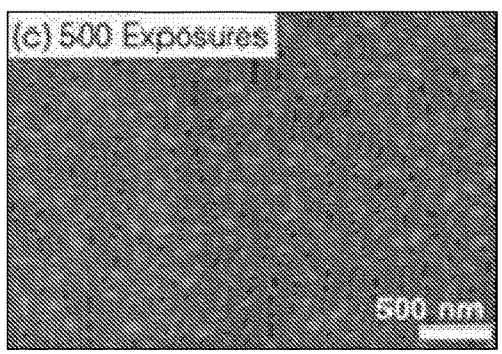
Figure 3D:
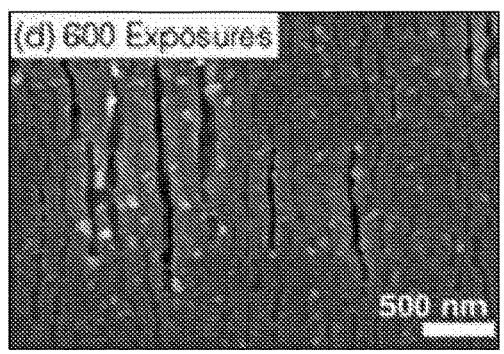
Figure 3E:
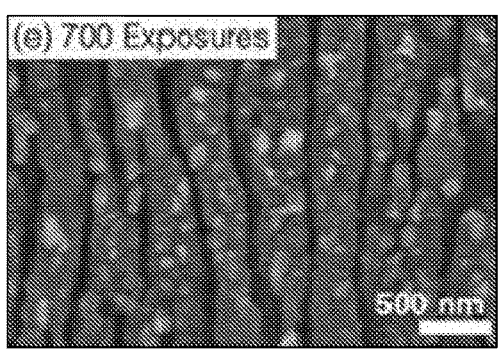

The islands and pits continue to organize and form an intermediate LIPSS population with a distribution of spacings centered at 165 nm with a 60 nm full-width half maximum (FWHM) aligned perpendicular to the laser polarization as shown in FIG. 3(c) after ≈500 exposures. The surface then transitions to a longer distribution of periods centered at 355 nm with a 60 nm FWHM that nucleates locally throughout the 165 nm LIPSS in FIG. 3(d) after 600 exposures. This 355 nm population completely overtakes the 165 nm population in FIG. 3(e). The 355 nm transition occurs in less than 50 exposures. The 355 nm LIPSS bifurcate into the final HSFL over the course of the next 300 exposures with a distribution of periods centered at 180 nm with a FWHM of 90 nm in FIG. 3(f). These periods are fluence independent within the range of fluences between band-gap closure and ultrafast melt. The distribution of periods directly measured from the structure spacings for the aligned features are provided in FIG. 6. The mean for each distribution is consistent with periods calculated with Fourier transforms taken from the SEM images.

B. Point Defect Generation.

The HSFL evolution process is set in motion by a repeated laser material interaction lasting 150 femtoseconds per exposure. Seminal time-resolved X-ray diffraction experiments, confirming earlier theoretical work, demonstrated that the root-mean-squared displacement can be as much as an angstrom within a few hundred femtoseconds following laser excitation. This is possible because the ultrashort laser interaction depopulates the bonding states, weakening the attractive part of the interatomic potential, allowing the ions to drift with their initial thermal momentum until they collide with nearby ions. At the ultrafast melt threshold, these collisions result in a loss of long range order of the crystal within a picosecond. Just below the melt threshold, HSFL form at fluences where each interaction excites approximately 10% of the valence electrons causing transient loss of the imaginary part of the dielectric function and $X_2$, which can be used to characterize structural changes. At this level of excitation, semiconductors appear to completely recover their original dielectric properties after a single laser exposure with no surface morphological change. Despite the apparent recovery of the lattice, strong evidence will be presented that vacancy/interstitial pair generation occurs between the band-gap closure and ultrafast-melt thresholds.

To model ultrafast laser irradiation at fluences which correlate to the HSFL formation, a non-adiabatic QMD method was used. Briefly, the method incorporates the electromagnetic vector potential into the electronic Hamiltonian via a Peierls substitution that facilitates the electromagnetic-field induced excitation of electrons, and evolves the one-electron wavefunctions in time by solving Schrödinger's equation using a generalized Cayley algorithm. At each time step the forces on the ions are calculated using a generalized Hellman-Feynman theorem and integrated forward in time via the velocity-Verlet algorithm. The electron wave functions are expanded in a semi-empirical, orthogonal, sp3s* tight-binding basis. The basis functions were fit with particular attention to the optical properties, however, since the fit was limited to nearest-neighbor interactions, it is only possible to investigate the initial stages of defect formation and do not allow us to properly model the entire formation process, which will be addressed in future work.

The simulations were performed with 512 atoms and 2048 valence electrons at the Γ=(0,0,0) point in a cubic supercell 22.64 Å on a side with periodic boundary conditions. The supercell size was chosen to ensure that it was large enough to accommodate defect formation. The atoms were equilibrated at 300 K for 4 ps prior to the introduction of the laser pulse. The pulse had total duration of 150 fs with a cosine squared pulse envelope centered at 780 nm and polarized in the direction similar to the experiments. The time step was 40 as.

Figure 7A:
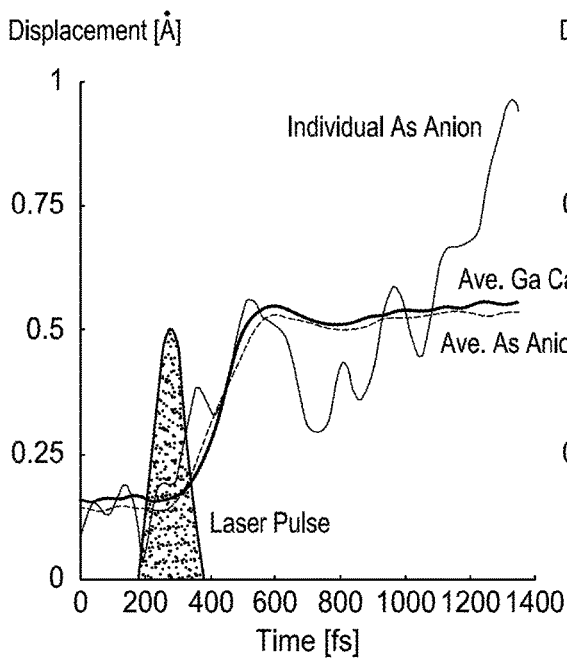
Figure 7B:
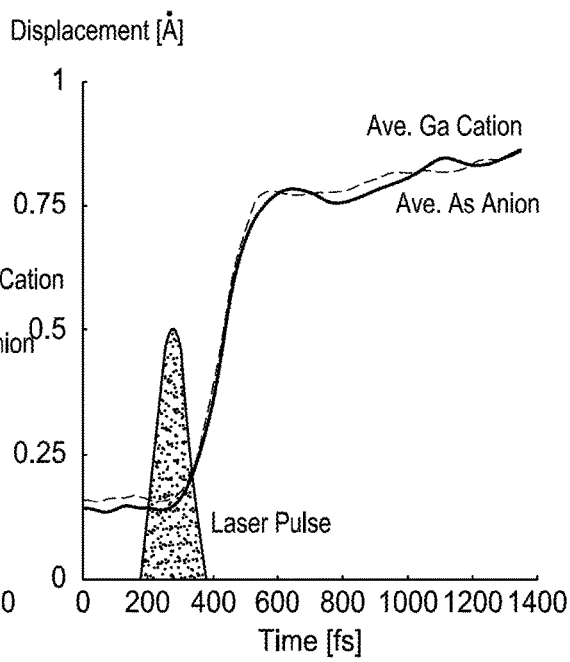

Experiments performed on InSb and also previous simulations on GaAs, Si, and InSb reveal that during or immediately after a sufficiently intense laser pulse the average ion motion is essentially freely drifting due to the weakening of the attractive part of the interatomic potential that results from the excitation of valence-band electrons to conduction-band states. FIG. 7 shows the average atomic displacements of the Ga cations and the As anions from the ideal 0° K positions for fluence 0.199 J/cm2, 81.6% of the simulated band-gap closure threshold, and 0.244 J/cm2—the simulated band-gap closure threshold in a and b respectively. The model fluences are above the experimental values due to an underestimation of the dielectric function in the model. The displacement is characterized by an initial rapid increase of the average displacement for ≈200 fs after the laser pulse followed by the establishment of a new mean distance even though the temperature has only slightly increased, as shown in FIG. 8. The relatively small ion temperature increases in the midst of such large atomic displacements is indicative of both the nonthermal and ultrafast nature of the point defect formation mechanism. Also shown in FIG. 7(a) is the motion of one particular As anion that showed large displacement from the mean within 1 ps of the laser pulse. This is the lowest fluence at which such large displacements were observed. The large excursion of this atom from the mean appears to be due to its initial position close to its 0° K equilibrium site along with momentum away from this site at the onset of the laser pulse. It is at this fluence that it is suspected that defect formation is initiated, although one should be cautious in placing too much significance on individual trajectories in mean-field simulations. At the band-gap closure threshold of 0.244 J/cm2, 14.2% of the valence electrons are excited. In this case, the average cation and anion displacements have increased substantially in FIG. 7(b). At this fluence, diffusive behavior is seen as characterized by the gradually increasing displacement that begins at ≈800 fs. Under these conditions, some fraction of the ions will drift more than an Å, and those with favorable initial conditions can reach an interstitial site. The interstitial site represents the real space location with the highest density of excited electrons after irradiation, and thus represents a likely site for excited electrons to recombine with an ion core. A configurational change that forms a vacancy/interstitial pair, similar to a dissociated Frenkel Pair, serves as a non-radiative pathway for the electrons to reoccupy bonding states. Repeating this process over multiple exposures causes defects to accumulate as long as the generation rate exceeds the recombination rate. The experimental and modeling evidence indicates that this threshold is the same as that for band-gap closure. The softened binding potential also increases mobility for previously generated defects. This both increases the probability of vacancy/interstitial pair dissociation and may enhance diffusivity of the resulting vacancies and self-interstitials.

C. Interaction of Diffusing Defects with SPPs

Figure 10E:
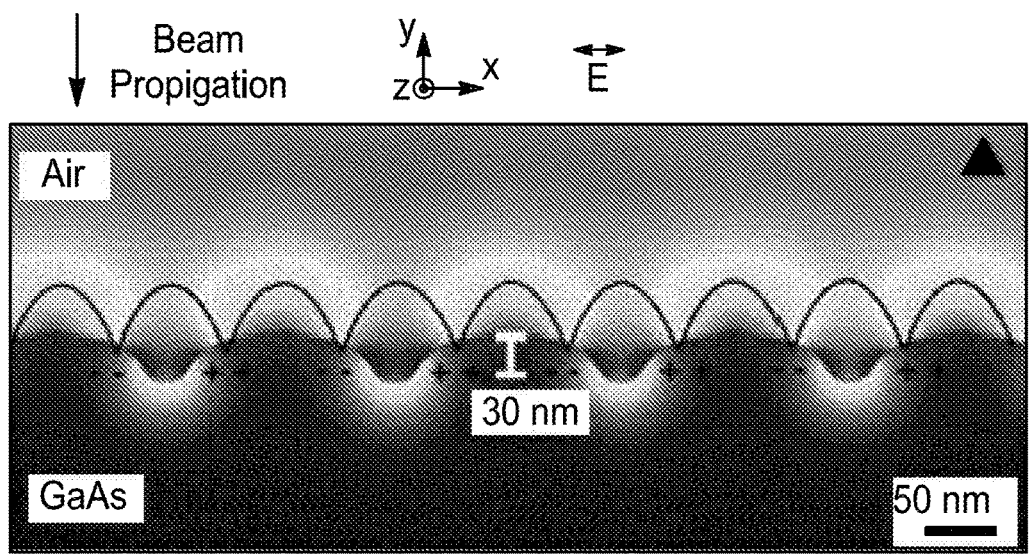
Figure 10F:
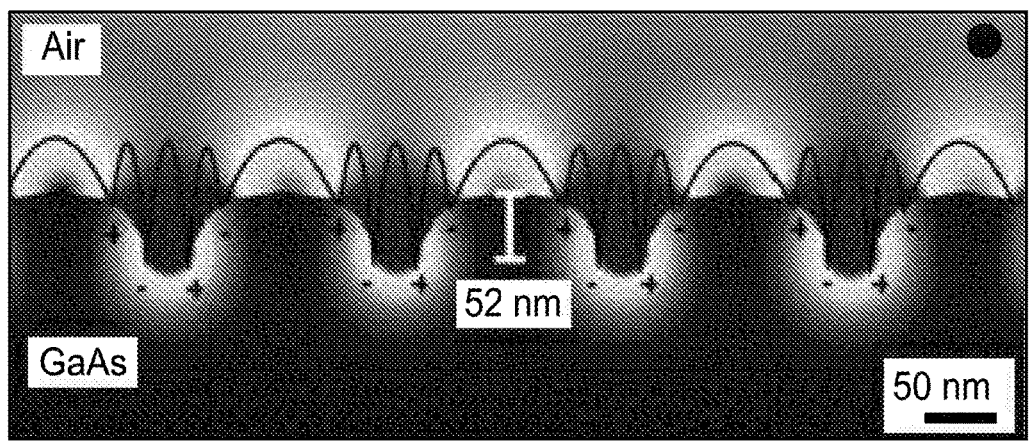

Self-interstitials, which are in a highly stressed state, will rapidly diffuse to the surface to relieve that stress, forming the small randomly oriented islands in FIGS. 4(a) and (b). This process is shown schematically in FIG. 4(c). Although the point defect formation mechanism differs for ultrafast laser irradiation, such islands are also commonly observed in other vacancy/interstitial diffusion based self-assembly processes such as ion beam irradiation and long pulse laser irradiation. The combination of continued growth from the bulk and surface coarsening leads to taller (≈1 nm) and wider (≈30 nm) islands spaced further apart as shown in FIG. 5(a). At this point, the islands begin to couple to SPPs, which localize the absorbed intensity and subsequent defect generation into the structure sidewalls as modeled using FEFD methods in FIG. 9(a). Simulations were performed by propagating a Gaussian beam through air toward a GaAs bulk in the negative y direction from the top to the bottom of the simulation box as shown in FIGS. 9(a), 10(e), and 10(f). The boundary conditions for the air at the top and sidewalls of the simulation box was a perfectly matched layer and a perfect electrical conductor. The GaAs layer was modeled with absorbing boundary conditions at the simulation bottom and sidewalls beneath the air/GaAs interface. The dielectric function of the laser excited GaAs was calculated as the sum of the ground state dielectric function and a Drude term for the excited electron hole plasma using Equation 2 below where $\varepsilon_g$ is the ground state dielectric function, $\omega_p$ is the plasma frequency, and $\Gamma$ is the electron collision frequency, which is typically on the order of 1 fs for laser excited semiconductors. The SPP wavelength is then calculated using Equation 3 where $\varepsilon_{Re}$ is the real part of the dielectric function for the excited GaAs and $\varepsilon_{Air}$ is assumed to be one. For calculating $\omega_p$, an electron concentration of half of the 10% required for ultrafast melting was chosen. This excitation of 5% of the valence electrons is consistent with typical values for irradiation with a fluence at 65% of the melt threshold, and reproduces the grating coupled SPP wavelength observed in GaAs during LSFL formation. Thus, the FEFD calculations shown below were performed with an excited dielectric function in GaAs of $\varepsilon = -10.7 + 1.5i$.

$$\varepsilon = \varepsilon_g + (1 - \omega_p^2/(\omega(\omega + i\Gamma))) \quad (2)$$

$$\lambda_{SPP} = \lambda_{Laser}[(\varepsilon_{Re} + \varepsilon_{Air})/(\varepsilon_{Re} \cdot \varepsilon_{Air})]^{1/2} \quad (3)$$

For the islands modeled in FIG. 9(a), the SPP couples according to the shallow grating coupled SPP for a 2 nm tall island using the dispersion curve described by $k_{SPP} = k_{Laser}[(\varepsilon_{Re} \cdot \varepsilon_{Air})/(\varepsilon_{Re} + \varepsilon_{Air})]^{1/2}$ where k is a wave vector and $\varepsilon_{Re}$ is the real part of the dielectric function for the excited semiconductor. The regions where the SPP enhances absorption experience a higher local defect generation rate, higher mobility, and preferential growth. The relative local enhancement in absorbed intensity from SPP coupling to the shallow grating as the islands grow further apart is shown in FIG. 9(c). Within the FEFD calculations it was assumed that island height, diameter, and spacing are coupled and scale linearly between the initial 20 nm and aligned 60 nm islands and maintained the same growth rate for larger islands. Also, pits were modeled to nucleate when the islands reached the 165 nm spacing where they are observed experimentally. When only islands are present, as shown schematically in FIG. 9(d), the relative absorbed intensity at the island edges increases as the system is stepped through the experimentally determined sizes and inter-island spacings. However, as soon as pits are introduced into the model with an inter-island spacing consistent with the experimental observations, as shown schematically in FIG. 9(e), the island edges experience a sudden drop in local absorption, pinning the system to the existing inter-island spacing. Allowing the islands to increase in both height and diameter after pits nucleate leads to further losses in absorption within the grating sidewalls while fixing the island diameter and only increasing feature height increases the relative absorbed intensity. The 165 nm period thus represents the spacing at which local absorption in the grating sidewall is enhanced enough such that vacancy generation rate and mobility becomes high enough to nucleate the pits observed in the AFM image in FIG. 10(a).

The 165 nm LIPSS continue to grow higher and deeper, shown in FIG. 10(b), forming a shallow grating where SPP dispersion curve follows the well-known shallow grating coupled formulation. The SPP couples via this formulation as long as the grating depth is less than 50 nm as shown in the FEFD simulation in FIG. 10(e) as charge separation within the structure sidewalls. As grating amplitude increases above 50 nm, a band-gap forms in the dispersion curve at 2kSPP=kgrating leading to a photonic band-gap grating coupled SPP. As this band-gap forms, the grating wavelength that permits SPP coupling along the upper branch of the dispersion curve increases toward a maximum where the density of states is the highest, the SPP energy is the lowest, and a standing wave can be supported. This upper branch coupling for LIPSS with 165 nm period and a depth greater than 50 nm appears in the FEFD simulation in FIG. 10(f) as charge separation at the structure crests and troughs. The amplitude of LIPSS growth varies across the surface, and thus the sharp transition to upper branch coupling occurs at random sites. This random "nucleation" is seen in the SEM and AFM images in FIGS. 3(d) and 10(c) respectively. As the amplitude of the LIPSS continues to increase, these "nuclei" grow into each other leading to a grating that is not perfectly coherent across the entire laser spot. The grating's wavelength distribution is centered around 355 nm in FIGS. 3(e) and 6(b), which is the at the band edge of the dispersion curve.

Figure 3F:
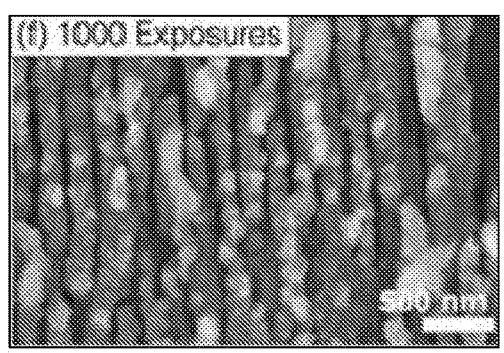

Continued irradiation of the 355 nm LIPSS results in the strain driven bifurcation after 1,000 exposures shown in the SEM image in FIG. 3(f). After 1,500 exposures, only the 180 nm HSFL remain and the period remains unchanged even when increasing the number of laser exposures to 100,000. A cross-section STEM image of the HSFL formed after 1,500 exposures is imaged in FIG. 2(a) along the zone axis of the original GaAs. The nanocrystalline regions, which appear as light diffraction contrast in FIG. 2(a), form where the SPP locally increases the absorbed intensity and generated defects within the HSFL, as shown in the FEFD simulation in FIG. 2(e). Within the highly defective regions of the structures, the generation of vacancy/interstitial pairs after each additional laser exposure results in a net compressive stress in the GaAs. This stress increases the chemical potential, which may be accommodated by a change in surface curvature to decreases the surface energy. This leads to a sinusoidal cross-sectional shape to relieve compressive stress within the structures while locally placing the crests under tension and the troughs under compression. For the 355 nm LIPSS, this so called "stress-driven instability" is confined by the ridge width, forming a local minimum in the height profile at the center of each structure. The alternating regions of local tension and compression create sinks for vacancies and interstitials, which drives the HSFL bifurcation as interstitials preferentially diffuse to the structure crests and vacancies coalesce at the trench troughs. Since there is already a pre-existing grating before bifurcation, the process requires a defect concentration capable of initiating a strain driven instability at the 180 nm wavelength. The stable wavelength for a strain driven instability is given in Equation 4 below as:

$$\lambda=(4/3)\pi M\gamma/\sigma 2 \quad (4)$$

where $\lambda$ is the stable wavelength, M is the modulus, $\gamma$ is the surface energy, and $\sigma$ is the stress. For the ground state InGaAs/GaAs, ≈0.5 J/m2 and M is 147 GPa. This yields a bifurcation stress of 1.3 GPa. This value is consistent with the 1-5 GPa that build up in the near surface from vacancies/interstitial generation during ion beam growth of ripples. The vacancy rich nanocrystalline region also increases mobility during recrystallization, growing a single crystal above the original surface, shown in cross-section STEM in FIG. 2(b), that remains epitaxial to the GaAs below the original surface in FIG. 2(c). The recrystallization process provides an alternate vacancy sink, which prevents the material from accumulating sufficient stress to drive a second LIPSS bifurcation. The combination of interstitial and vacancy diffusion produces HSFL with an amplitude of 350-400 nm after 1,500 exposures in FIG. 2(a) that retain their original stoichiometry in cross-section STEM energy dispersive x-ray spectroscopy in FIG. 2(d). A schematic of this stress-driven bifurcation mechanism is provided in FIG. 2(f). Further, Ga droplets are not observed on the structure surfaces, which indicates that growth temperature does not exceed 933° K and is consistent with ion temperatures during defect formation predicted by QMD in FIG. 8.

IV. Summary

The eight step process through which the surface evolves en route to HSFL formation is detailed below:

1. Defect generation in the bulk and self-interstitial diffusion to the surface forms islands, leaving a high concentration of vacancies below the surface.

2. The combination of growth from the bulk generated interstitials and surface coarsening leads to larger random but fewer islands that are also spaced further apart.

3. Islands align with coherent spacings in the direction of the laser polarization when they couple to SPPs as they grow to roughly 1 nm heights.

4. Enhanced absorption from SPP coupling in the island sidewalls localizes defect generation. Where defect generation rate is the highest, the vacancy concentration reaches a point where they coalesce into pits between islands in the direction of the laser polarization. This pins islands at their current spacings that have grown to roughly 2 nm heights.

5. Once the spacing is pinned to 165 nm, the islands and pits become crests and troughs (now they are LIPSS), which increase their corrugation amplitude with subsequent exposures.

6. Increasing LIPSS amplitude both opens up a band-gap in the SPP dispersion curve and allows for coupling along the upper branch.

7. SPP coupling to a grating at the band-edge leads to the nucleation and growth of the 355 nm LIPSS.

8. Stress accumulation within the 355 nm LIPSS and localization of stress to the structure centers leads to bifurcation into the 180 nm HSFL via a stress-driven morphological transformation.

In summary, the theoretical backing for the mechanisms responsible for the cascade of morphologies during HSFL evolution in semiconductors has been determined. QMD simulations show that irradiation within the fluence range between the band-gap closure and melt thresholds allows for the ultrafast generation of vacancy/interstitial pairs. The HSFL evolve after hundreds of exposures due to the interplay between SPPs and transient surface morphologies driven by stress relaxation, via diffusing defects. The laser/surface plasmon interaction distributes the local absorbed intensity, as shown in FEFD calculations, to enhance the vacancy/interstitial generation process based on the pre-existing surface morphology from the previous laser exposure. This local enhancement of pair generation leads to selective growth at the observed LIPSS periods during the morphological evolution. Understanding the formation mechanisms of these structures should allow for further control over the self-assembly of epitaxial nanoscale semiconductor surface morphological structures.

As described herein, the method according to the present teachings is particularly unique in that the corrugation is produced without any melting or ablation of the material, thereby producing single crystal material. In fact, this method represents a new way of growing laser assisted epitaxial material where the flux of atoms comes from the bulk instead of from an external target. The material is redistributed, all in the solid phase. Its usefulness has been demonstrated in connection with III-V, II-VI, and group IV semiconductors and have preliminary evidence that it will also be present in many covalent wide band gap semiconductors, i.e. GaN, SiC, SiN, ZnO, etc.

This process can occur in ambient condition (in air) without the need for a high vacuum system. This is a remarkable finding in itself because it has been commonly believed that epitaxial redistribution near a surface requires a vacuum. Hence, the present teachings are applicable to a wide range of devices including, but not limited to, solar cells, batteries, chemical, biological, and light sensors etc. The ability to process in air makes this novel approach even more attractive for producing a product. Furthermore, this process is easily combined with traditional manufacturing methods for these kinds of devices such as, but not limited to, molecular beam expitaxy, chemical beam expitaxy, gas entrainment deposition, atomic layer deposition, and sputter deposition. Such combinations, along with thermal annealing techniques, greatly enhance the benefits of the present teachings by enabling production of pn junctions, Schottky or Ohmic contacts, modulation doped layers, etc. to create novel devices.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method of manufacturing a surface corrugation in a material using light energy, said method comprising:

applying a plurality of laser energy pulses focused at a surface of the material, each of said plurality of laser energy pulses being about 150 femtoseconds in duration, said plurality of laser energy inducing point defect accumulation and diffusion in the material resulting in epitaxial surface corrugation, the epitaxial surface corrugation having a period less than 0.3 times a wavelength of the laser.

2. The method according to claim 1 wherein the inducing point defect accumulation and diffusion in the material resulting in epitaxial surface corrugation is achieved in the solid phase of the material.

3. The method according to claim 1 being performed in conjunction with any one of groups III-V, II-Vi, and IV semiconductors.

4. The method according to claim 1 wherein the applying a plurality of laser energy pulses at the material is performed in ambient air conditions.

5. The method according to claim 1 wherein the applying a plurality of laser energy pulses at the material results in the formation of a single crystal material.

6. A method of manufacturing a surface corrugation in a material using light energy without melting or ablation, said method comprising:

applying a plurality of laser energy pulses focused at a surface of the material, each of said plurality of laser energy pulses being at an intensity less than that required to melt or ablate the material, said plurality of laser energy inducing point defect accumulation and diffusion in the material resulting in epitaxial surface corrugation.

7. The method according to claim 6 wherein the epitaxial surface corrugation having a period less than 0.3 times a wavelength of the plurality of laser pulses.

8. The method according to claim 6 wherein the inducing point defect accumulation and diffusion in the material resulting in epitaxial surface corrugation is achieved in the solid phase of the material.

9. The method according to claim 6 being performed in conjunction with any one of groups III-V, II-Vi, and IV semiconductors.

10. The method according to claim 6 wherein the applying a plurality of laser energy pulses at the material is performed in ambient air conditions.

11. The method according to claim 6 wherein the applying a plurality of laser energy pulses at the material results in the formation of a single crystal material.

* * * * *